(12) United States Patent
Oh et al.

(10) Patent No.: US 12,489,182 B2
(45) Date of Patent: Dec. 2, 2025

(54) TRANSMISSION LINE FOR MILLIMETER WAVE BAND USING VERTICAL TYPE PIN DIODE

(71) Applicant: SEOUL NATIONAL UNIVERSITY R&DB FOUNDATION, Seoul (KR)

(72) Inventors: Jungsuek Oh, Seoul (KR); Jinhyun Kim, Seoul (KR)

(73) Assignee: SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 218 days.

(21) Appl. No.: 18/281,512

(22) PCT Filed: Jul. 23, 2021

(86) PCT No.: PCT/KR2021/009546
§ 371 (c)(1),
(2) Date: Oct. 23, 2023

(87) PCT Pub. No.: WO2022/191364
PCT Pub. Date: Sep. 15, 2022

(65) Prior Publication Data
US 2024/0162591 A1 May 16, 2024

(30) Foreign Application Priority Data

Mar. 12, 2021 (KR) .......................... 10-2021-0032743
Jul. 16, 2021 (KR) .......................... 10-2021-0093595

(51) Int. Cl.
*H01P 1/15* (2006.01)
(52) U.S. Cl.
CPC ...................................... *H01P 1/15* (2013.01)
(58) Field of Classification Search
CPC .... H01L 2023/4031; H01L 25/03; H01P 1/15; H03K 23/80
(Continued)

(56) References Cited

U.S. PATENT DOCUMENTS 5,446,424 A   8/1995  Pierro
6,545,552 B2  4/2003  Kim et al.
(Continued)

FOREIGN PATENT DOCUMENTS

JP    2012-084723 A    4/2012
KR   10-2002-0001626 A   1/2002
(Continued)

OTHER PUBLICATIONS

PCT International Search Report, PCT/KR2021/009546, Nov. 29, 2021, 4 Pages.

*Primary Examiner* — Andrea Lindgren Baltzell
*Assistant Examiner* — Abigail Amir Yaldo
(74) *Attorney, Agent, or Firm* — Fenwick & West LLP

(57) ABSTRACT

This transmission line for a millimeter wave band using a vertical type PIN diode comprises: a diode layer comprising a vertical type PIN diode and a metal column of the same size as the vertical type PIN diode; an upper signal application substrate which is located on the diode layer and comprises metal columns for transferring a millimeter wave signal to the diode layer; a lower signal application substrate located under the diode layer; an upper bonding film for connecting the diode layer to the upper signal application substrate; and a lower bonding film for connecting the diode layer to the upper signal application substrate. By applying a vertical type PIN diode which is very small in size compared to SMD type diodes of existing types and may be mounted within an intermediate substrate, the freedom in designing an antenna and a circuit may be significantly improved.

6 Claims, 5 Drawing Sheets

(58) Field of Classification Search
USPC .......................... 333/262; 327/528; 222/262
See application file for complete search history.

(56) References Cited

U.S. PATENT DOCUMENTS

| | | |
|---|---|---|
| 8,644,197 B2 | 2/2014 | Lee et al. |
| 2002/0093386 A1 | 7/2002 | Kim et al. |
| 2010/0157858 A1 | 6/2010 | Lee et al. |

FOREIGN PATENT DOCUMENTS

| | | |
|---|---|---|
| KR | 10-2002-0061200 A | 7/2002 |
| KR | 10-2011-0130389 A | 12/2011 |
| KR | 10-1159654 B1 | 6/2012 |
| KR | 10-2012-0126222 A | 11/2012 |
| KR | 10-2017-0067610 A | 6/2017 |
| KR | 10-2020-0143286 A | 12/2020 |

TRANSMISSION LINE FOR MILLIMETER WAVE BAND USING VERTICAL TYPE PIN DIODE

TECHNICAL FIELD

The present invention relates to a transmission line structure for transferring a signal in a millimeter wave band, and more particularly, to a transmission line structure having a high degree of freedom in design while having various responses by applying a vertical type PIN diode within a single transmission line structure of a stacked type substrate.

DESCRIPTION OF SPONSORED RESEARCH

This research was supported by the Seoul National University Creative Leading Young Researchers Support Program, an on-campus support program of the Seoul National University (project name: Application research on tunable irreversible metamaterial antenna/circuit and radar miniaturization, project identification number: 0668-20200230).

BACKGROUND ART

Millimeter wave technology is a communication method that transmits data using a high frequency band (30 to 300 GHz) with a wavelength in units of millimeters (mm), and a bandwidth of approximately 800 MHz or more can be used, and the transmission speed of data can be significantly improved by using such a wide bandwidth.

When a transmission line including a diode is implemented in the millimeter wave band, due to the characteristic of a millimeter wave signal with a very short wavelength, when a reverse voltage is applied to the diode, the diode operates as a capacitor rather than an open circuit to transfer the millimeter wave signal. In this case, the capacitance of the diode has a filter response by implementing the transmission line and resonator.

Various circuits have been designed using the response characteristics of these diodes, but a commercial diode is manufactured as a surface mount device (SMD) type, which cause a problem of relatively large size and being able to be mounted only on a flat substrate. In addition, when the SMD type diode is used, not only the size of an antenna and circuit becomes larger, but also a circuit for power application needs to be additionally designed on the flat substrate to implement the diode on the flat substrate, and when stacked type substrate technology is used, it is impossible to mount the diode in an intermediate substrate, which greatly limits the degree of freedom in the design of the antenna and circuit.

DISCLOSURE

Technical Problem

Accordingly, the present invention is directed to providing a transmission line structure for a millimeter wave band that have a high degree of freedom in design and is capable of miniaturization while exhibiting different responses depending on an applied voltage, by implementing a vertical type diode in a substrate based on semiconductor process technology and stacked type substrate technology.

Technical Solution

There is provided a transmission line for a millimeter wave band using a vertical type pin diode according to an embodiment of the present invention, the transmission line includes: a diode layer including a vertical type PIN diode and a metal column of the same size as the vertical type PIN diode; an upper signal application substrate located on the diode layer and including metal columns configured to transfer a millimeter wave signal to the diode layer; a lower signal application substrate located under the diode layer; an upper bonding film configured to connect the diode layer to the upper signal application substrate; and a lower bonding film configured to connect the diode layer to the lower signal application substrate.

According to an embodiment, the vertical type PIN diode may be configured with a P-type doped region adjacent to the upper bonding film, an N-type doped region adjacent to the lower bonding film, and a true semiconductor region located between the P-type and N-type doped regions.

According to an embodiment, the upper bonding film may include metal columns electrically connected to metal columns of the upper signal application substrate, and metal patterns configured to electrically connect a vertical type PIN diode and the metal column of the diode layer to the metal columns of the upper bonding film, respectively, and in which the lower bonding film may include metal patterns configured to electrically connect the vertical type PIN diode and the metal columns of the diode layer.

According to an embodiment, the metal columns of the diode layer, the upper signal application substrate, and the upper bonding film may be formed to pass through each layer and be in contact with the metal columns or metal patterns of different layers, in which the metal pattern of the upper bonding film may be formed between the diode layer and the upper bonding film to electrically connect the vertical type PIN diode and the metal column of the diode layer to the metal columns of the upper bonding film, respectively, and in which the metal pattern of the lower bonding film may be formed between the diode layer and the lower bonding film to electrically connect the vertical type PIN diode and the metal column of the diode layer.

According to an embodiment, response characteristics of the transmission line may be controlled by adjusting a diameter of the vertical type PIN diode and a thickness of the metal pattern of the lower bonding film.

According to an embodiment, the metal columns of the upper signal application substrate may be bonded to the metal columns of the upper bonding film through solder paste.

According to an embodiment, the upper signal application substrate may include metal patterns to connect the metal columns of the upper signal application substrate to the ground.

Advantageous Effects

According to an embodiment of the present invention, there is provided a transmission line structure including an ultra-small PIN diode implemented vertically within a substrate using semiconductor process technology. While exhibiting a different response depending on the applied voltage, the vertical type PIN diode is very small in size compared to the existing SMD type diode and can be mounted in an intermediate substrate, thereby greatly improving the degree of freedom in the design of an antenna and circuit.

MODE FOR DISCLOSURE

The terms used in the present specification are selected from general terms currently widely used in the art in consideration of functions, but the terms may vary according to the intention of those skilled in the art, practice, or new technology in the art. Further, specified terms are selected arbitrarily by the applicant, and in this case, the detailed meaning thereof will be described in the description of the present specification. Thus, the terms used in the present specification should be defined based not on simple names but the substantial meaning of the terms and the overall description of the present specification.

Hereinafter, embodiments are described in detail with reference to the accompanying drawings and the contents described therein, but the scope of the claims is not limited or restricted by the embodiments.

Figure 1:
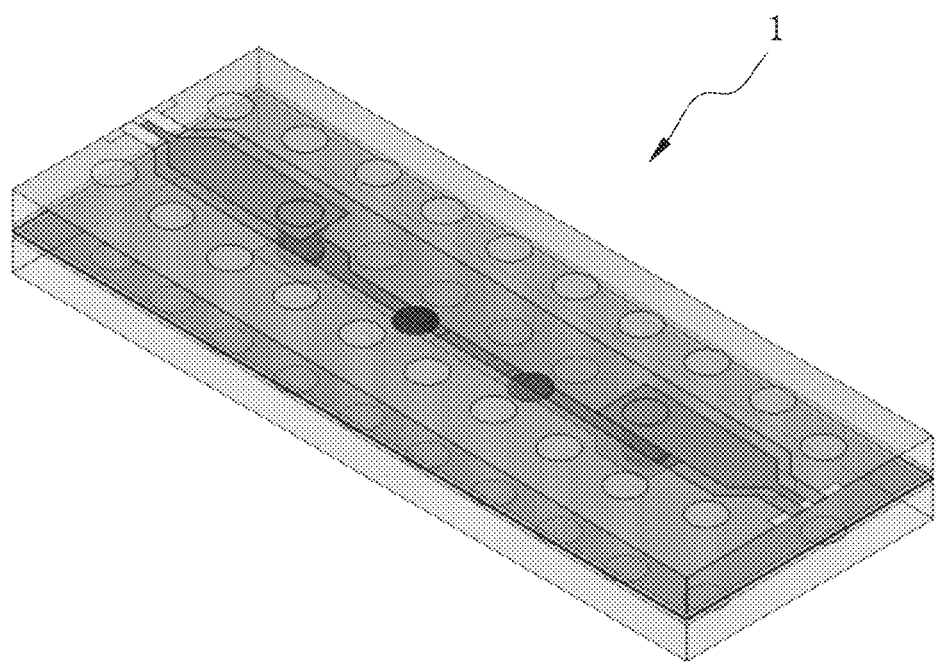
FIG. 1 is a perspective view illustrating a transmission line structure using a vertical type PIN diode according to an embodiment.

FIG. 1 is a perspective view illustrating a transmission line structure using a vertical type PIN diode according to an embodiment. As illustrated in FIG. 1, a transmission line 1 according to an embodiment is configured as a stacked structure in which upper and lower signal application substrates are bonded to a diode layer through upper and lower bonding films with the diode layer being centered, and a filter response may be exhibited according to a voltage applied to the transmission line by implementing a vertical type PIN diode on the diode layer that is an intermediate substrate.

Figure 2:
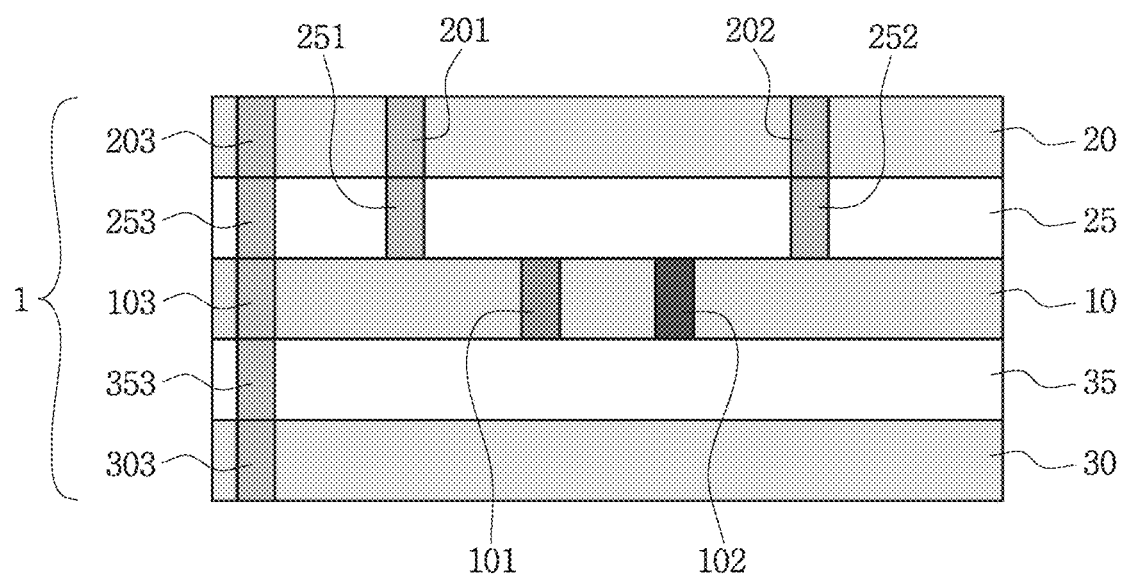
FIG. 2 is a cross-sectional view illustrating the transmission line structure using the vertical type PIN diode according to an embodiment.

FIG. 2 is a cross-sectional view illustrating a transmission line structure using the vertical type PIN diode according to the embodiment in FIG. 1. With reference to FIG. 2, the transmission line 1 according to an embodiment may be configured with a diode layer 10 in which a vertical type PIN diode is implemented; an upper signal application substrate 20 located on the diode layer 10; a lower signal application substrate 30 located under the diode layer 10; an upper bonding film 25 configured to connect the diode layer 10 to the upper signal application substrate 20; and a lower bonding film 30 configured to connect the diode layer 10 to the lower signal application substrate 20.

The diode layer 10 includes a vertical type PIN diode 101 and a metal column 102 of the same size as the vertical type PIN diode 101. The vertical type PIN diode 101 is formed through semiconductor process technology and configured with a P-type doped region (a region adjacent to the upper bonding film 25), an N-type doped region (a region adjacent to the lower bonding film 35), and a true semiconductor region located between the P-type and N-type doped regions. The metal column 102 is formed in a symmetrical structure opposite the PIN diode 101 for measuring an output signal.

An upper surface of the diode layer 10 is connected to the upper signal application substrate 20 through the upper bonding film 25, and a lower surface thereof is connected to the lower signal application substrate 30 through the lower bonding film 35. The upper and lower bonding films 25 and 35 are bonded to the diode layer 10 and the upper and lower signal application substrates 20 and 30 through a bonding material on each surface thereof. In addition, the metal columns that pass through these substrates are electrically connected through solder paste. That is, in FIG. 2, metal columns 201 and 202 of the upper signal application substrate 20 are electrically connected to metal columns 251 and 252 of the upper bonding film 25, respectively, and metal columns 103, 203, 253, 303, and 353 that pass through each layer are also electrically connected to form a single circuit.

Figure 3:
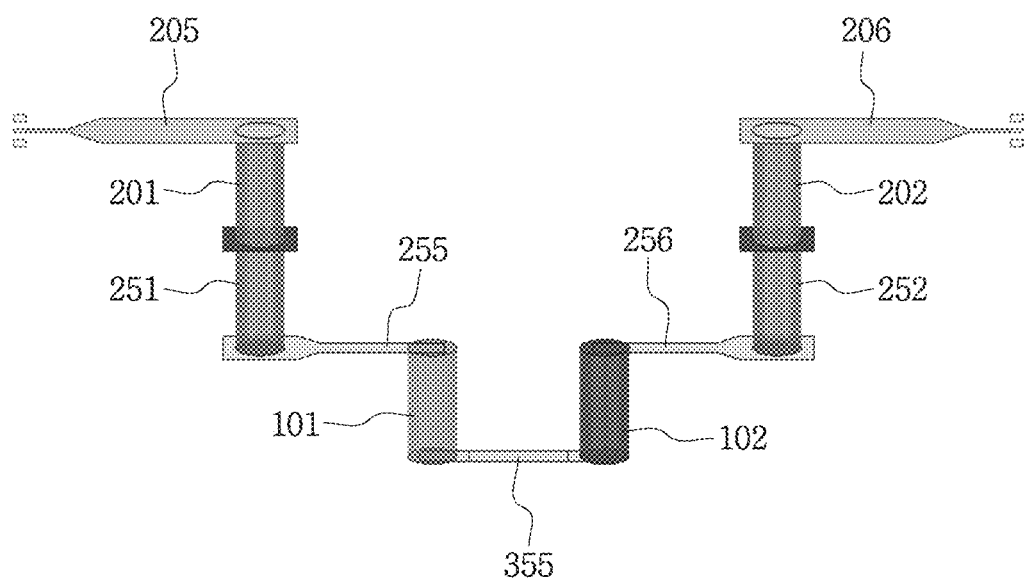
FIG. 3 is a schematic view illustrating the transmission line structure using the vertical type PIN diode according to an embodiment.

FIG. 3 is a schematic view illustrating the transmission line structure using the vertical type PIN diode according to an embodiment.

With reference to FIG. 3, the upper bonding film includes the metal columns 251 and 252 electrically connected to the metal columns 201 and 202 of the upper signal application substrate (as described above, these metal columns are connected through solder paste), and metal patterns 255 and 256 configured to electrically connect the vertical type PIN diode 101 and the metal column 102 of the diode layer to the metal columns 251 and 252 of the upper bonding film, respectively. The metal patterns 255 and 256 of the upper bonding film may be formed between the diode layer and the upper bonding film through a semiconductor process. In addition, the lower bonding film includes a metal pattern 355 configured to electrically connect the vertical type PIN diode 101 to the metal column 102 of the diode layer, which may be formed between the diode layer and the lower bonding film.

According to an embodiment, a thickness of the diode layer 10 is fixed at 5um, and then a diameter of the PIN diode 101 and a thickness of the metal pattern 355 connecting the PIN diode 101 to the metal column 102 may be adjusted to control the response characteristics of the transmission line.

According to an embodiment, to implement a transmission line of a ground coplanar waveguide (GCPW) structure, the metal patterns of a lowermost layer and the metal patterns of an uppermost layer are electrically connected and uniformly connected to the ground through the plurality of metal columns 103, 203, 253, 303, and 353 that pass through each layer, as illustrated in FIG. 2. As illustrated in FIGS. 1 and 3, metal patterns 205 and 206 are formed on the upper signal application substrate for measurement of the millimeter wave band, in which the metal patterns 205 and 206 are gold-plated and configured to be in contact with a probe.

The metal pattern of the uppermost layer consists of ground metals at both ends and a signal metal portion in a center for the implementation of CPW type. A line with a non-rectangular mitering method applied is used for the signal metal portion due to a probe size of 50 um of the millimeter wave band and a minimum process unit of 300 um for a via-hole process, and a signal input through an input unit is transferred through the metal pattern to the bonding film located under the signal application substrate. The PIN diode, implemented perpendicular to the bonding film, is also connected by the metal pattern and transfers a signal through a metal column implemented in the same size on an opposite side of the PIN diode for symmetry.

Figure 4:
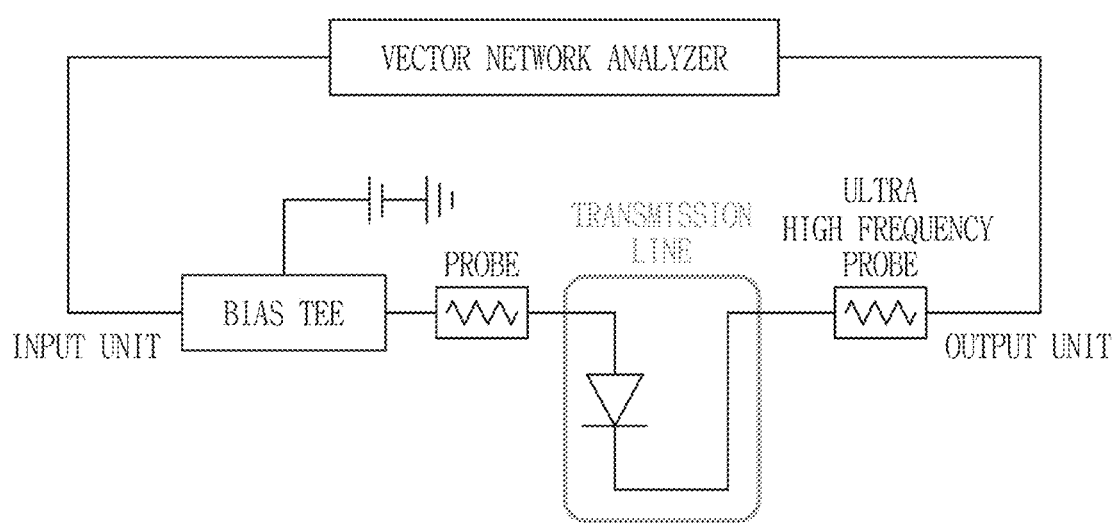
FIG. 4 is a circuit diagram illustrating a measurement environment of the transmission line using the vertical type PIN diode according to an embodiment.

FIG. 4 is a circuit diagram illustrating a measurement environment of the transmission line using the vertical type PIN diode according to an embodiment. With reference to FIG. 4, S-parameter characteristics of the transmission line are analyzed with a vector network analyzer and a bias tee is used to apply an appropriate voltage to the PIN diode. After the bias tee is connected to the input unit, the probe of the millimeter wave band is connected to perform de-embedding through calibration. Then, a signal is applied through a contact between the probe and the gold-plated pattern, and the results are extracted using the vector network analyzer. In addition, the state of the PIN diode is adjusted to be turned on or off by sequentially applying a voltage from 0 V to 2 V through the bias tee.

Figure 5:
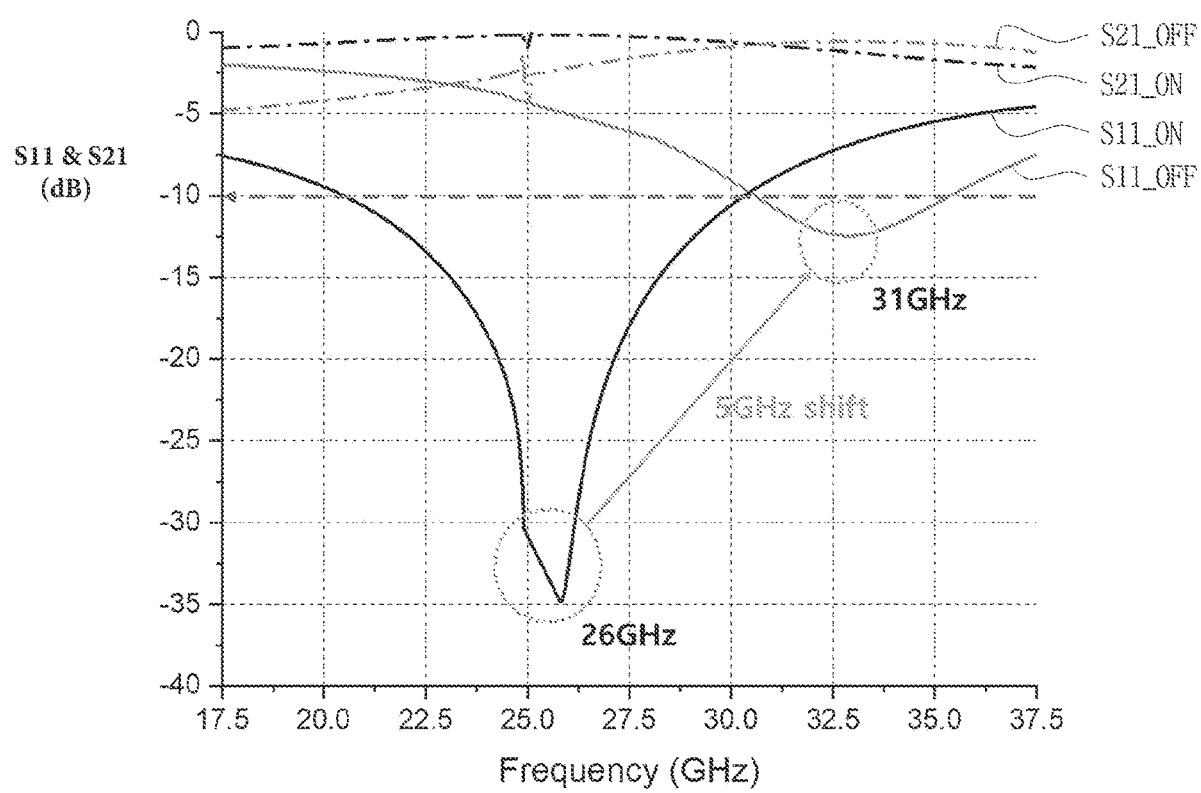
FIG. 5 illustrates a simulation result according to turning on/off a PIN diode in the transmission line according to the embodiment described above.

FIG. 5 illustrates a simulation result according to turning on/off a PIN diode in the transmission line according to the embodiment described above. In the graph, the solid line S11_OFF and dashed line S21_OFF represent S-parameter analysis results when the PIN diode is turned off, and the solid line S11_ON and dashed line S21_ON represent S-parameter results when the PIN diode is turned on. When the PIN diode is turned on, the transmission characteristics of a signal with a center frequency of approximately 31 GHz are exhibited by the characteristics of the transmission line. In contrast, when the PIN diode is turned off, the PIN diode is modeled as a capacitor, which causes the center frequency of the transmission characteristics to shift. In FIG. 5, it can be seen that with the PIN diode turned off, the transmission of the signal occurs with the center frequency of 26 GHz. Therefore, it can be seen that the transmission characteristics of the signal change by approximately 5 GHz with reference to the center frequency depending on the PIN diode being turned on/off. In addition, it can be seen that at 26 GHz, S11 in the state of the PIN diode turned on is approximately −5 dB, which indicates that only a very small amount of signal is transmitted. That is, at the center frequency where the transmission characteristics of each state are observed, it can also be seen that the opposite state will cause reflection of the signal, resulting in no transmission of the signal.

According to the embodiment described above, there is provided a transmission line structure including an ultra-small PIN diode implemented vertically within a substrate using semiconductor process technology. While exhibiting a different response depending on the applied voltage, the vertical type PIN diode is very small in size compared to the existing SMD type diode and can be mounted in an intermediate substrate, thereby greatly improving the degree of freedom in the design of an antenna and circuit.

While the present invention has been described above with reference to the embodiments, it may be understood by those skilled in the art that the present invention may be variously modified and changed without departing from the spirit and scope of the present invention disclosed in the claims.

The invention claimed is:

1. A transmission line for a millimeter wave band using a vertical type pin diode, the transmission line comprising:
    a diode layer including the vertical type PIN diode and a first metal column of a same size as the vertical type PIN diode, the first metal column being disposed on an opposite side of the vertical type PIN diode with respect to a centerline of the diode layer;
    an upper signal application substrate located on the diode layer and including second metal columns configured to transfer a millimeter wave signal to the diode layer;
    a lower signal application substrate located under the diode layer;
    an upper bonding film configured to connect the diode layer to the upper signal application substrate; and
    a lower bonding film configured to connect the diode layer to the lower signal application substrate,
    wherein the upper bonding film comprises third metal columns electrically connected to the second metal columns of the upper signal application substrate, and first metal patterns configured to electrically connect the vertical type PIN diode and the first metal column of the diode layer to the third metal columns of the upper bonding film, respectively,
    wherein the lower bonding film comprises second metal patterns configured to electrically connect the vertical type PIN diode and the first metal column of the diode layer, and
    wherein the first metal patterns are disposed between the diode layer and the upper bonding film, and the second metal patterns are disposed between the diode layer and the lower bonding film.

2. The transmission line of claim 1, wherein the vertical type PIN diode is configured with a P-type doped region adjacent to the upper bonding film, an N-type doped region adjacent to the lower bonding film, and a true semiconductor region located between the P-type doped region and the N-type doped region.

3. The transmission line of claim 1, wherein the upper signal application substrate comprises third metal patterns configured to be in contact with a millimeter-wave probe and to connect the second metal columns of the upper signal application substrate to ground.

4. The transmission line of claim 1, wherein the first metal column, the second metal columns, and the third metal columns extend through respective layers and contact at least one of the first metal patterns or the second metal patterns of different layers.

5. The transmission line of claim 1, wherein response characteristics of the transmission line are controlled by adjusting a diameter of the vertical type PIN diode and a thickness of at least one of the second metal patterns of the lower bonding film.

6. The transmission line of claim 1, wherein the metal columns of the upper signal application substrate are bonded to the third metal columns of the upper bonding film through solder paste.

* * * * *